United States Patent [19]

Imamura

[11] Patent Number: 4,984,731

[45] Date of Patent: Jan. 15, 1991

[54] METHOD OF PACKAGING ELECTRONIC COMPONENT PARTS USING A EUTECTIC DIE BONDER

[75] Inventor: Tetsuichi Imamura, Fukuoka, Japan

[73] Assignee: Matsushita Electric Industrial Co., Ltd., Osaka, Japan

[21] Appl. No.: 417,427

[22] Filed: Oct. 5, 1989

[51] Int. Cl.[5] .............................................. H01L 21/58

[52] U.S. Cl. .................................... 228/102; 228/103; 228/180.2; 228/105; 29/833; 29/840

[58] Field of Search ..................... 228/103, 180.2, 102; 29/705, 740, 741, 833, 840

[56] References Cited

U.S. PATENT DOCUMENTS

| | | | |
|---|---|---|---|
| 4,586,247 | 5/1986 | Murai et al. | 29/705 |
| 4,896,418 | 1/1990 | Yearsley | 29/833 |
| 4,899,921 | 3/1990 | Bendat et al. | 228/180.2 |
| 4,927,068 | 5/1990 | Naka et al. | 228/180.2 |

*Primary Examiner*—Kenneth J. Ramsey

*Attorney, Agent, or Firm*—Wenderoth, Lind, & Ponack

[57] ABSTRACT

The inventive method for packaging electronic component parts on a substrate by eutectic bonding after the substrate has been heated to exceed the eutectic temperature is designed to observe the thermal expansion of the substrate with a camera and moves the substrate stage in accordance with the observation result so as to modify the mount coordinates of the component part, thereby compensating the displacement of component parts caused by the substrate thermal expansion.

6 Claims, 3 Drawing Sheets

1
2
3
4
5
11
12
15
16
17
17a
18
19
20
21
22
23
24
25
26
27
P

METHOD OF PACKAGING ELECTRONIC COMPONENT PARTS USING A EUTECTIC DIE BONDER

BACKGROUND OF THE INVENTION

The present invention relates to a method of packaging electronic component parts using a eutectic die bonder, and particularly to a method of correcting the displacement of electronic component parts caused by the thermal expansion of a substrate.

A known method of packaging electronic component parts on a substrate is to heat the substrate with a heating unit up to a eutectic temperature (e.g., 400°-450° C.) and fix the parts by eutectic bonding. Electronic component parts intended for eutectic bonding are not molded and called "bare chips", and this type of electronic component parts are generally required to be mounted at a very high accuracy.

A substrate heated by a heating unit expands. Particularly, when the substrate is a metallic lead frame, it expands in the longitudinal direction due to its large thermal expansivity, resulting in a positioning error of component parts and thus a degraded mount accuracy.

Accordingly, an object of the present invention is to provide a method of readily correcting the displacement of electronic component parts caused by the thermal expansion of the substrate.

SUMMARY OF THE INVENTION

The inventive method is designed to heat a substrate with a pre-heating unit and then place the substrate on a movable table provided in a main heating unit and heat it to exceed the eutectic temperature, and, at eutectic bonding of electronic component parts on the substrate, observe the thermal expansion of the substrate with a camera and move the movable table in accordance with the observation result so as to modify the mount coordinates of the component part.

The substrate heated to a temperature above the eutectic temperature by the pre-heating unit and main heating unit behaves a significant thermal expansion. The camera is used to observe the thermal expansion of the substrate, and the movable table is moved in accordance with the observation result so as to modify the mount coordinates of an electronic component part, thereby correcting the displacement of electronic component parts caused by the substrate thermal expansion.

DESCRIPTION OF THE PREFERRED EMBODIMENT

An embodiment of the present invention will be described with reference to the drawings.

Figure 1:
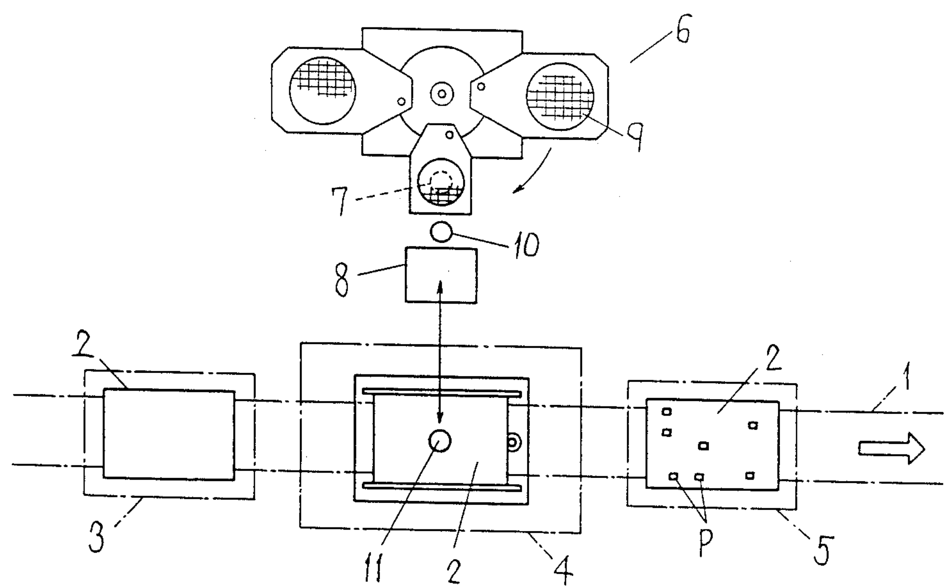
FIG. 1 is a plan view of the inventive bonding apparatus.
Figure 2:
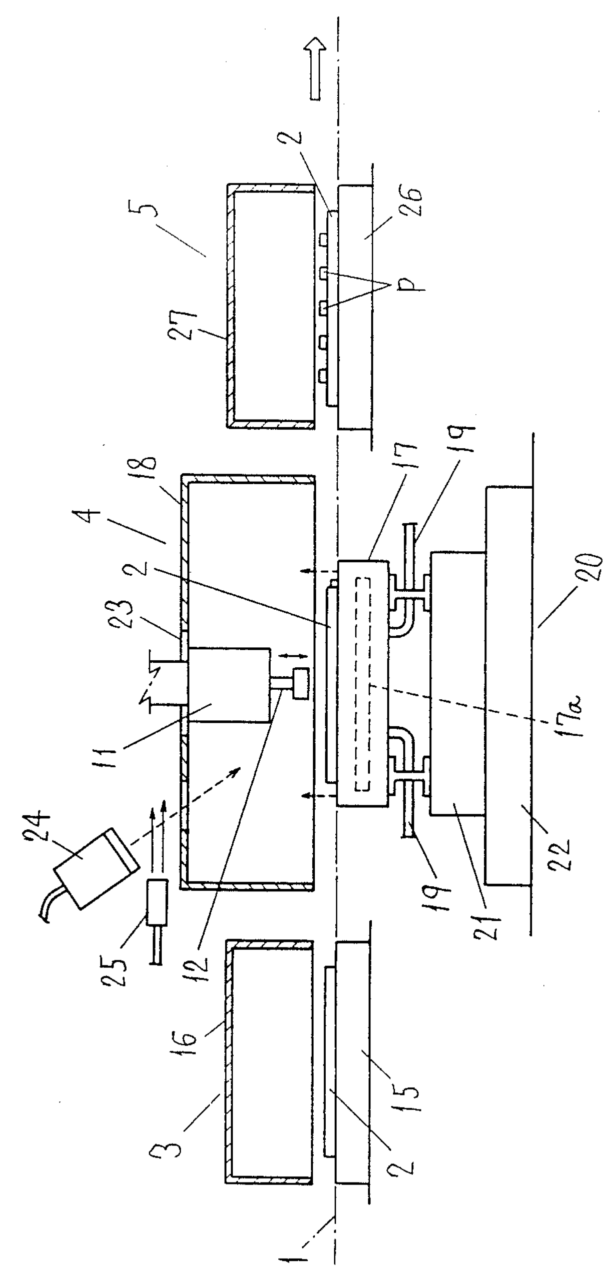
FIG. 2 is a side view of the substrate transportation path.

FIG. 1 is a plan view of the die bonding apparatus, and FIG. 2 is a side view of the substrate transportation path. Indicated by 1 is a conveyer for transporting a substrate 2, and disposed along the transportion path are a pre-heating unit 3, main heating unit 4 and a post heating unit 5. The substrate 2 is pre-heated by the pre-heating unit 3, and subsequently it is heated by the main heating unit 4 to a temperature above the eutectic temperature. Disposed along the line orthogonal to the main unit 4 are a part feeder 6 equipped with wafers 9, a die ejector 7 and an alignment unit 8. Indicated by 10 is a moving head which shuttles between the die ejector 7 and alignment unit 8, and picks up an electronic component part pushed up over the wafer 9 by the plunger of the die ejector 7 and feeds it to the alignment unit 8, by which the displacement of the part in the x, y and $\theta$ directions is observed and corrected. Indicated by 11 is a mount head, which picks up the part on the alignment unit 8 and mounts it on the substrate 2 that has been heated by the main heating unit 4. Electronic component parts are packaged on the substrate 2 as shown by P.

In FIG. 2, the pre-heating unit 3 comprises a heater 15 and a cover 16 disposed over it, and serves to heat the substrate 2 to 150°-200° C. The main heating unit 4 also comprises a heater 17 and a cover 18 disposed over it, and serves to heat the substrate 2 to a temperature above the eutectic temperature. The eutectic temperature differs depending on the bonding material, and it is about 370° C. for eutectoid of gold and silicon, for example.

Indicated by 20 is a positioning unit for the substrate 2, and it comprises movable tables 21 and 22 moving in the X and Y directions, respectively, beneath the heater 17 which incorporates a heating element 17a. The mount head 11 moves into the interior of the cover 18 through an opening 23 formed in it, and operates to bond an electronic component part P on the substrate 2 which has been positioned over the heater 17.

Figure 3:
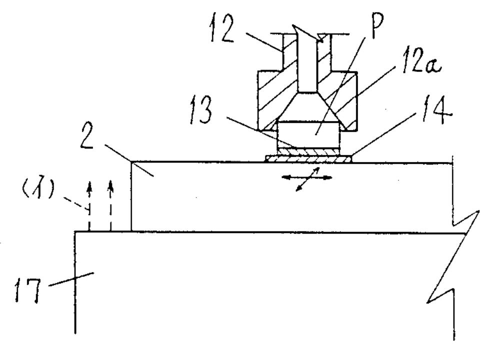
FIG. 3 is a side view of the bonding apparatus in the bonding process.

FIG. 3 shows the bonding process in which a part P held by a suction nozzle 12 is brought in contact with the substrate 2 and bonded to it. The nozzle 12 has a box-shaped suction tip 12a formed at its end. Indicated by 13 and 14 are bonding materials of gold, for example, provided on the bottom surface of the part P and the upper surface of the substrate 2. At a temperature above the eutectic temperature, the moving tables 21 and 22 are moved slightly so that the materials 13 and 14 are rendered a frictional slide, and the materials are connected. Consequently, the part P is bonded to the substrate 2.

Indicated by 24 is a camera located above the cover 18, and it is used to observe the thermal expansion of the substrate 2. A blower 25 is provided, and a blast of air removes a flame so as to ensure the clear observation of the substrate 2 for the camera 24. In order for the bonding materials 13 and 14 to be rid of oxidation during the heating of the substrate 2 by the main heating unit 4, such reducing gas as nitrogen or hydrogen is introduced to the interior of the cover 18 through a pipe 19. The pipe 19 supplies the reducing gas to the heater 17, and the gas heated by the heating element 17a is released through the upper surface of the heater 17 and it heats the substrate 2 (refer to the dashed arrows (a)). The post heater 5, which comprises a heater 26 and a cover 27, heats the substrate 2 on which electronic component parts P have been bonded, and the substrate 2 is conveyed to the next processing apparatus.

Figure 4:
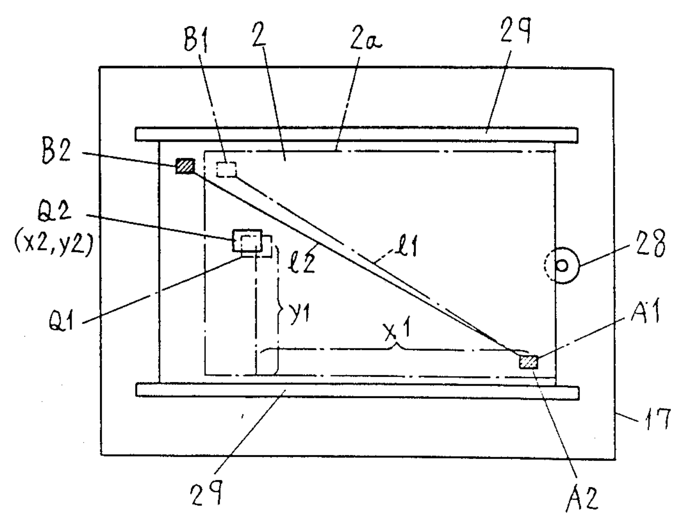
FIG. 4 is a plan view of the bonding apparatus in the observation process.

FIG. 4 shows the observation, by the camera 24, of the substrate 2 which has been positioned by the positioning unit 20. Indicated by 28 is a substrate stopper, 29 are clamps for fixing the substrate 2, A2 and B2 are reference marks printed at the corners of the substrate 2 for detecting the displacement, 2*a* is a master substrate which provides the reference of inspection, and Al and Bl are reference marks on it. The substrate 2 is significantly larger due to expansion than the master substrate 2*a*, as shown in the figure. Indicated by Ql is the ideal packaging position with coordinates xl, yl of an electronic component part when the substrate has no thermal expansion, and Q2 is the position with coordinates x2, y2 of the part to be mounted through the compensation in the x and y directions so as to offset the thermal expansion. Indicated by l1 is the distance between points A and B on the master substrate, and l2 is the distance between points A and B on the actual substrate 2. The substrate 2 has a thermal expansion of $\Delta l = l1 - l2$ between the points A and B. Accordingly, the mount coordinates of the part are given by the following equations.

$$x2 = \frac{l2}{l1} x1 \quad (1)$$

$$y2 = \frac{l2}{l1} y2 \quad (2)$$

In accordance with the calculated mount coordinates (x2, y2), the moving tables 21 and 22 are moved, and the displacement caused by the thermal expansion of the substrate 2 can be compensated. The calculation of the coordinate is carried out using a computer. In case the substrate has an elongated shape as of lead frames, the thermal expansion in the Y direction is negligibly small, and in this case only the moving table 21 is moved for the compensation in the X direction.

As described above, the inventive method is designed to observe the thermal expansion of the substrate with a camera, and the movable table on which the substrate is placed is moved in accordance with the observation result so that the mount coordinates of an electronic component part are modified, whereby the displacement caused by the thermal expansion of the substrate at eutectic bonding of the part can readily be corrected and the part mount accuracy can be enhanced.

What is claimed is:

1. A method of packaging electronic component parts using a eutectic die bonder comprising the steps of: placing a substrate on a movable table which is provided in a heating unit; measuring the thermal expansion of the substrate while heating the substrate; and moving the movable table in accordance with the result of measurement so as to modify the bonding coordinates of an electronic component part.

2. A method of packaging electronic component parts according to claim 1, wherein said heating unit heats said substrate to a temperature which is a eutectic temperature of the electronic component part to be bonded and the substrate, or higher.

3. A method of packaging electronic component parts using a eutectic die bonder comprising the steps of: heating a substrate with a preheating unit; placing the substrate on a movable table which is provided in a main heating unit; measuring the thermal expansion of the substrate while heating the substrate; and moving the movable table in accordance with the result of measurement so as to modify the bonding coordinates of an electronic component part.

4. A method of packaging electronic component parts according to claim 3, wherein said movable table comprises a two-dimensional movable table.

5. A method of packaging electronic component parts using a eutectic die bonder comprising the steps of: heating a substrate with a preheating unit; placing the substrate on a movable table which is provided in a main heating unit; measuring the thermal expansion of the substrate from an image signal produced by an image recognition unit which images a substrate while the substrate is heated; and moving the movable table in accordance with the result of measurement so as to modify the bonding coordinates of an electronic component part.

6. A method of packaging electronic component parts according to claim 5, wherein said image recognition unit comprises a video camera.

* * * * *